United States Patent [19]

Taylor, Jr. et al.

[11] Patent Number: 4,724,396
[45] Date of Patent: Feb. 9, 1988

[54] DIGITAL AUDIO AMPLIFIER

[75] Inventors: Wilson E. Taylor, Jr.; Larry E. Hand, both of Meridian, Miss.

[73] Assignee: Peavey Electronics Corporation, Meridian, Miss.

[21] Appl. No.: 874,379

[22] Filed: Jun. 13, 1986

Related U.S. Application Data

[63] Continuation-in-part of Ser. No. 643,315, Aug. 21, 1984, Pat. No. 4,600,891.

[51] Int. Cl.$^4$ .............................................. H03F 3/38
[52] U.S. Cl. ....................................... 330/10; 330/284
[58] Field of Search ...................... 330/10, 207 A, 251, 330/284, 279, 307

[56] References Cited

U.S. PATENT DOCUMENTS 4,178,556  12/1979  Attwood ............................... 330/10
4,600,891   7/1986  Taylor, Jr. et al. ......... 330/207 A X

FOREIGN PATENT DOCUMENTS 0063111  5/1980  Japan .................................... 330/284

OTHER PUBLICATIONS

Audio, vol. 47, No. 6, Jun. 1963, pp. 24,26,28,30,49,50; US, G. F. Cooper: "Class D Amplifiers."
Journal of the Audio Engineering Society, vol. 31, No. 11, Nov. 1983, pp. 842,853; New York, US; B. E. Attwood: "Design Parameters Important for the Optimization of Very-High-Fidelity PWM (Class D) Audio Amplifiers."
Patents Abstracts of Japan, vol. 1, No. 153, Dec. 8, 1977, p. 8109 E 77 & JP-A-52 94 761 (Sony K.K.) 08-09-1977.

*Primary Examiner*—Eugene R. LaRoche
*Assistant Examiner*—Steven J. Mottola
*Attorney, Agent, or Firm*—Berman, Aisenberg & Platt

[57] ABSTRACT

A digital amplifier contains a circuit for converting the onset of a clipping condition into a missed pulse in a pulse width modulated pulse train generated from an analog signal and an improved circuit for producing a control voltage proportional to the extent of the clipping condition, which circuit includes a pulse counter for counting a predetermined number of missed pulses in the pulse train and a voltage generator for producing a voltage proportional to the extent of clipping when said predetermined number of missed pulses occurs. The generated voltage is applied to an attenuator for attenuating the analog input signal.

7 Claims, 9 Drawing Figures

DIGITAL AUDIO AMPLIFIER

This application is a continuation-in-part of application Ser. No. 643,315, filed Aug. 21, 1984, now U.S. Pat. No. 4,600,891 issued July 15, 1986.

BACKGROUND OF THE INVENTION

The present invention relates to the field of high fidelity audio-amplifiers, and more particularly such amplifiers employing digital techniques.

Audio-amplifiers have been marketed in the past, wherein the analog audio signal to be amplified is converted into pulse trains which are modulated in accordance with the analog signal, such pulse trains being amplified by power switching amplifiers, and the output thereof being applied to low-pass filters for reconstructing the audio signal thus amplified. However, the results produced by such amplifiers currently on the market are deemed to be below the level of excellence of sound reproduction desired.

It is an object of the present invention to provide an extremely high fidelity audio-amplifier employing audio signal modulated pulse trains which are amplified to high power output levels, and yet producing very low distortion (less than 0.1%) and a minimal degree of feedback (approximately 22 dB).

In conventional audio-amplifiers, the input and output waveforms are scaled and compared for differences, and these differences are thresholded to achieve distortion detection. In accordance with the amplifier of the present invention, this process is simplified whereby the input audio signal is converted into a sequence of high frequency pulses which control power switches, which in turn apply amplified pulse trains to a reconstruction filter to reconstruct the amplified audio input. The power switches employed for amplification function in a digital manner with their transistors fully saturated or fully cutoff, so as to operate most efficiently, and the various features of the invention result in the aforesaid level of excellence.

SUMMARY OF THE INVENTION

The above stated objects of the invention are accomplished in the preferred embodiment by providing a modulator for transforming the analog audio input signal into two complementary trains of pulse width modulated signals for driving the power switches, which modulator utilizes a precision triangular waveform to control the transformation. The modulator employs all differential processing without saturated transistors to achieve a minimal distortion modulation system. Upon the occurrence of over-modulation, pulses from the width modulated pulse train produced by the modulator are dropped, and the resulting loss of pulses is detected and fed back to a variable gain amplifier stage of the system. The signal resulting from the detection of missing pulses by the missing pulse or distortion detector reduces the system input gain and signal level and can limit system distortion for up to 20 dB of input overdrive. The distortion detection system for detecting the missing pulses is coupled between the modulator and a voltage controlled attenuator and utilizes a timing network to establish the missing pulse period necessary to begin input attenuation of the audio signal by the variable gain amplifier stage.

The reconstruction filter includes a low-pass section for recovering the amplified audio and a notch filter section having notches centered to eliminate the fundamental of the switching frequency. A variable inductor is employed in connection with a section of the notch filter for aiding in the proper notching of the signals to maximize surpression of the switching frequency, such inductor being coupled to the feedback network, and is adjusted by the factory while observing output distortion until the distortion attains a minimum level. The reconstruction filter also includes a tapped inductor functioning as an autotransformer which introduces offsets in the output switching waveform of the power amplifier to effectively compensate for crossover distortion due to energy recovery diode overswings and power switch voltage drops. This circuit increases system efficiency by eliminating series diodes formerly necessary to prevent forward conduction of integral body drain diodes in the power MOSFETS used as switching elements in the power amplifier. Also, a short circuit protection circuit employs a mono-stable multivibrator (MSMV) which is triggered upon the detection of excessive audio current and inhibits the operation of the modulator within 2 microseconds, thereby to immediately inhibit the application of input pulses to the power switching amplifiers until the multi-vibrator is re-enabled after a fixed time delay.

Other objects, features and advantages of the present invention will become apparent upon study of the following description taken in conjunction with the drawings in which:

SPECIFIC DESCRIPTION

Figure 1:
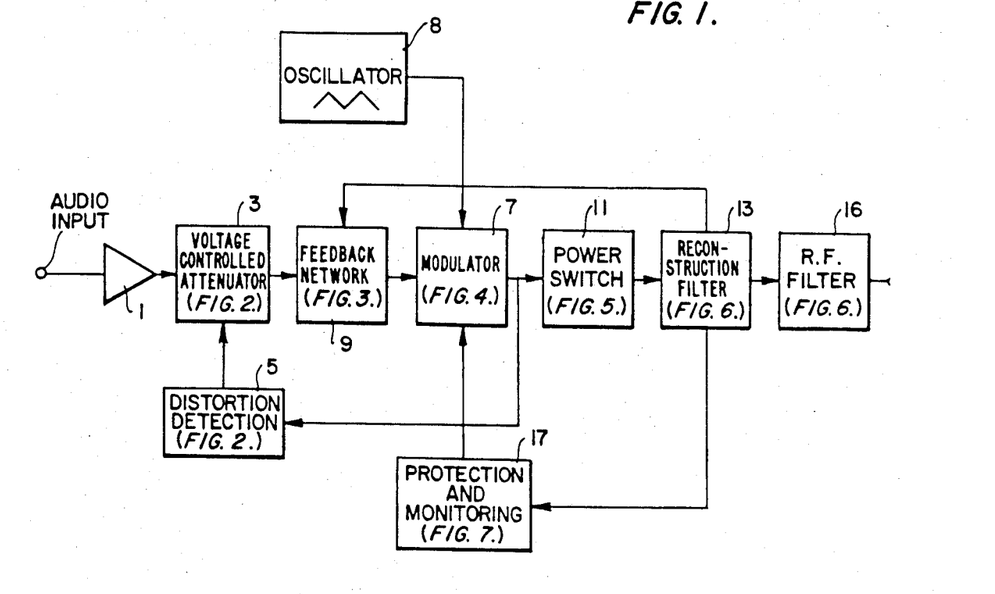
FIG. 1 discloses the overall organization of the circuitry of the preferred embodiment of the invention.

Referring now to FIG. 1, illustrating the overall digital energy conversion amplifier (DECA), an audio input is amplified by input amplifier 1 and is transmitted to voltage controlled attenuator 3 which is normally set in the "no attenuation state". In this state this circuit contributes less than 0.001% of the total distortion, although it is capable of up to 20 dB of attenuation, with less than 1% distortion. The audio signal is applied to the DECA modulator 7 via a feedback network 9. Network 9 consists of a series of lag/lead circuits for shaping the overall response of the amplifier which are designed to give an overall amplifier bessel response. Modulator 7 converts the incoming analog signal into a series of digital pulses which are pulse width modulated. This conversion is accomplished by comparing the input analog data to a fixed frequency sampling signal produced by oscillator 8. The signal is preferably a triangular wave, which permits double edge modulation of the applied signal, thus reducing distortion for a given sampling frequency. A level slicing technique of the triangular waveform is produced as described below to produce two pulse width modulated trains which are applied to power switch 11 which amplifies these pulse trains. The power switches are employed in a digital manner with their transistors fully saturated or fully off to maintain maximum efficiency of operation. The resulting amplified signals, having slew rates in excess of 5000 volts/microsecond, are applied to reconstruction filter 13 which functions to retrieve the D.C. component of the amplfied pulse trains which is a replica of the audio-input signal. Filter 13 employs a low pass filter network to eliminate the undesirable high frequency content of the amplified pulse trains while retaining the high quality analog data, and includes several notch filters, centered to eliminate the fundamental and third harmonic of the pulse train, and also employs an autotransformer co-acting with energy recovering diodes, to produce circulating current which forces the high power switching transistors in power switch circuitry 11 to operate in their most efficient switching region. A radio frequency filter 16 is coupled to the output circuit of filter 13 to completely eliminate the residual pulse train signals which may otherwise be present.

A drop in the frequency of the digital pulse trains developed in modulator 7 occurs when the analog input from feedback network 9 exceeds the amplitude of the triangular waveform. This action is due to output clipping caused by the application of an analog signal which is greater than the amplifier can reproduce at nominal gain. The occurrence of clipping, reduces the frequency of the digital pulse train developed by modulator 7, and a timing circuit within distortion detection unit 5, is employed to forward a signal to voltage controlled attenuator 3 which attenuates the input audio signal pursuant to the reduction of frequency of the pulse trains developed in modulator 7. Modulator 7 utilizes differential processing without employing saturated transistors, thereby to achieve a minimal distortion modulation system. Protection and monitoring circuitry 17 disables the drive signal pulse trains generated in modulator 7, within 1 microsecond, in the event of a fault condition. For example, a short circuit condition produces excessive current through the reconstruction filter, which is employed to actuate a MSMV to inhibit the operation of the digital pulse train amplifying circuitry in modulator 7. The MSMV is automatically reset after a short time, and is again set upon the occurrence of a new fault condition.

Figure 2:
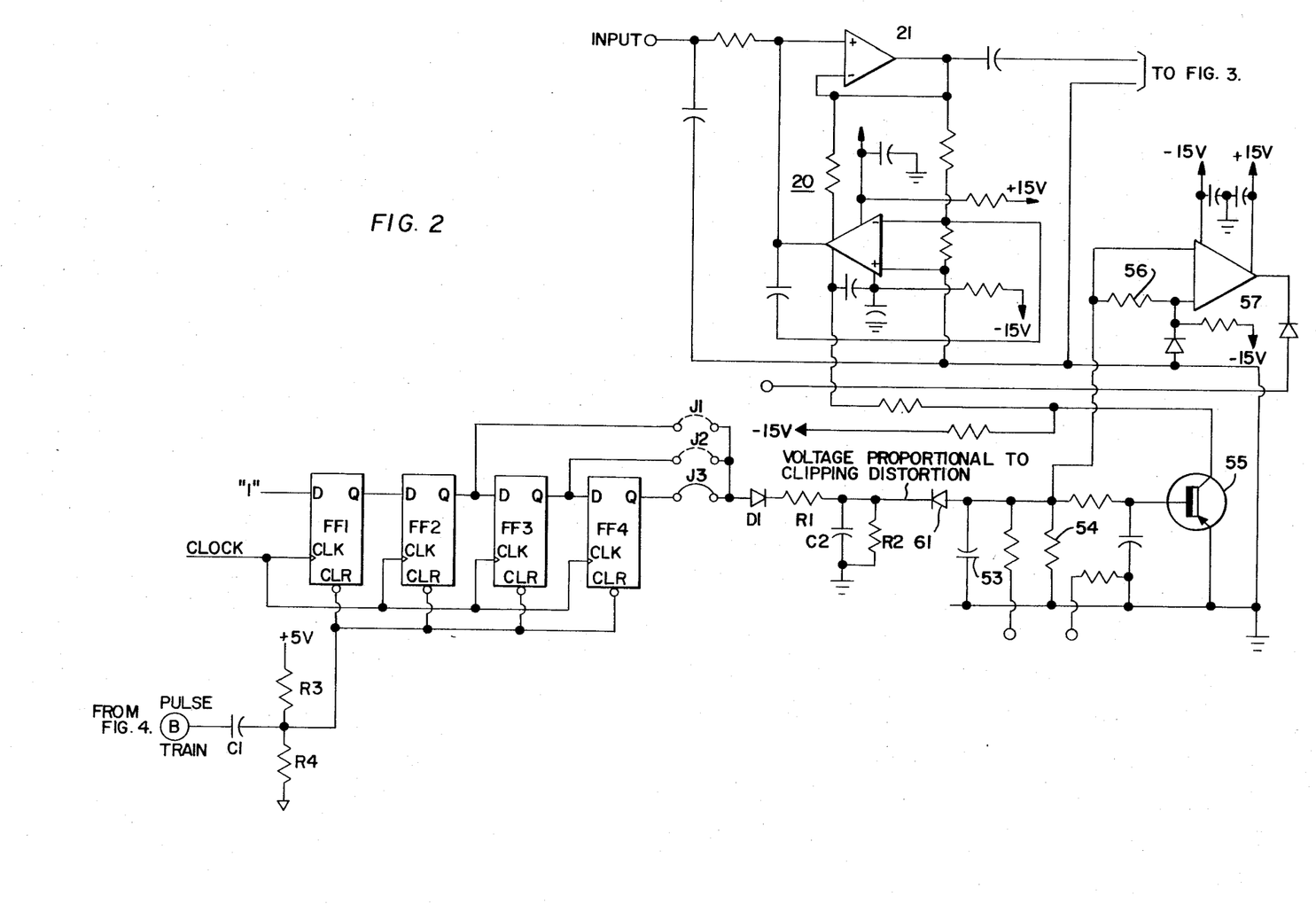
FIG. 2 illustrates the voltage controlled attenuator together with the missing pulse detector for controlling the attenuator and FIG. 2A is a block diagram of the missing pulse detector.
Figure 4:
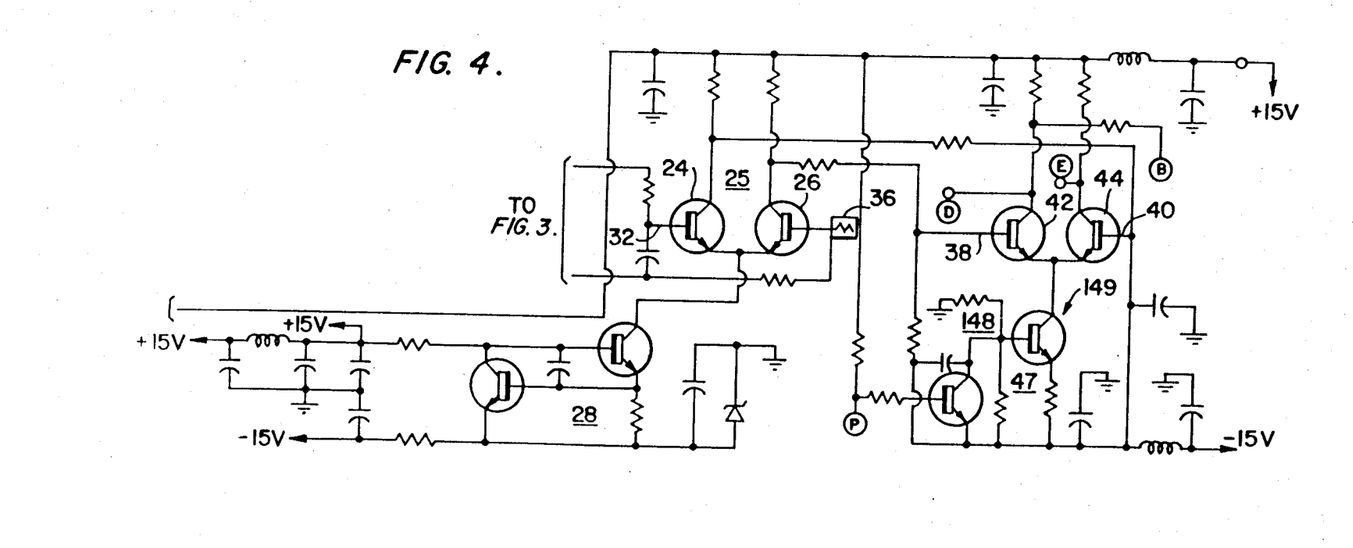
FIG. 4 illustrates the modulator.

Referring now to FIG. 2, input amplifier 21 receives the audio-input signal which is transmitted through amplifier 22 and 23 of the feedback network designated 9 in FIG. 2. FIG. 4, which is directed toward the DECA modulator, includes a pair of transistors 24 and 26 coupled to current source 28 and functioning as a comparator. The amplified audio signal produced at the output terminal 31 of amplifer 23 of the feedback network is applied to the base 32 of comparator transistor 24. Triangular waveform pulse generator 36 is coupled to the base of transistor 26, and in accordance with the level slicing modulation operation of the present invention, a series of pulse trains will be produced at the collectors of transistors 24 and 26 which are fed to the inputs 38 and 40 of the amplifier of FIG. 4 comprising transistors 42 and 44 which transistors function to amplify the pulse width modulated trains produced by transistors 24 and 26. The emitters of transistors 42 and 44 are coupled to a current source 47 which may be employed to rapidly shut off the supply of current to transistors 42 and 44 in accordance with fault conditions to be described below.

Figure 8:
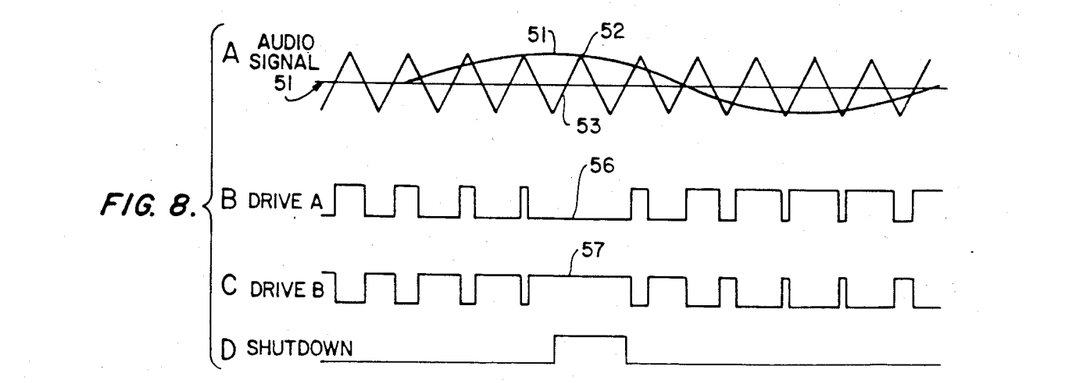
FIG. 8 illustrates certain waveforms which are helpful in the understanding of the operation of the modulator of FIG. 4.

The drive waveforms are produced in accordance with the level slicing technique by comparator 25 which generates the pair of pulse width modulated output signals of FIG. 8B and 8C which serve as complementary drive signals for transistors 42 and 44 which in turn will ultimately drive the power switching amplifiers discussed below. The variable audio signal is applied through amplifiers 22 and 23 to the base of transistor 24 whic functions in a non-saturating mode, while the triangular waveform shown in FIG. 8A from generator 36 is applied to the base of transistor 26 of comparator 25. As indicated by FIGS. 8A through 8C, the comparator 25 produces pairs of pulse width modulated signals having transistions corresponding to the crossover points of the triangular waveform with regard to the variable audio signal shown in FIG. 8A. As audio signal 51 increases as shown at the left-hand portion of FIG. 8A, the duty cycle of the positive going drive pulses of FIG. 8B will be reduced although their frequency will remain the same; likewise with respect to the negative going pulse train of FIG. 8C generated by the level slicing technique of comparator 25. The audio signal 51 may at some point such as at 52 exceed the amplitude of triangular waveform 53, and the operation of comparator 25 will result in the absence of a pulse as indicated at 56 of FIG. 8B and 57 in FIG. 8C. This condition is caused by output clipping due to the application of an audio-input signal greater than the level that the amplifier may reproduce at nominal gain and the result is a drop in the frequency of the pulse train indicated at 56 and 57 occurring when the audio signal exceeds the peak-to-peak amplitude of 53. This condition will be detected by the distortion detection circuit 5 of FIG. 1 to be explained below. Should the audio signal 52 become more negative than the bottom portion of the triangular waveforms, pulses will again be dropped to indicate an overdrive condition of the amplifier. The pulse trains of FIG. 8B and 8C are applied to the input terminals 38 and 40 of the amplifier including transistors 42 and 44, wherein the pulse train is amplified and transmitted to the input circuits of the push-pull solid state pulse train amplifiers of FIG. 5.

Thus in accordance with the level slicing technique of the present invention executed by the structure of FIG. 4, a periodic waveform is applied to one input terminal of comparator 25 and a signal proportional to the audio input signal is applied to the input terminal of transistor 24. It is important to note that the modulator of FIG. 4 does not employ saturated transistors, and differential processing without saturation achieves minimal distortion with respect to the modulation of the audio signal.

Figure 2A:
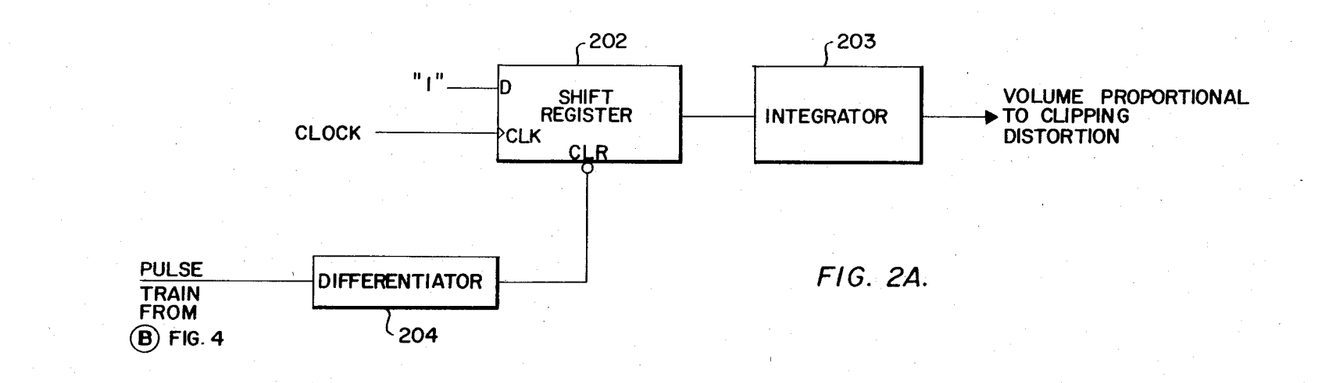

FIGS. 2A and the lower portion of FIG. 2 set forth an improved missing pulse detector. Detection is based on the fact that at the onset of clipping, the comparator output contains missing pulses as shown at 56 and 57 in FIGS. 8B and C, respectively. FIG. 2A is a block diagram of a system, according to the present invention, which provides an improved method of detecting the missing pulses. The system has the ability to:

1. Detect the missing pulses;
2. Set a threshold on the minimum number of missed pulses;
3. Integrate the missed pulses to develop a voltage proportional to the number of missed pulses; and 4. Adjust the attack and decay time constants for the integration.

As shown in FIG. 2A, the pulse train from terminal B of FIG. 4 is provided to the input of differentiator 204, the output of which is fed to multi-stage shift register 202. The block diagram shows a clock signal which is a digital square-wave clock synchronous with the triangle sampling signal 53 shown in FIG. 8A. The clock signal is used to clock a preset input value through shift register 202. As stated above, the pulse train signal is the output from the collector of transistor 42, designated terminal B. This signal is differentiated in differentiator 204 to produce a narrow pulse capable of resetting the shift register elements.

Under normal conditions of operation, wherein there are no missing pulses, the clock signal clocks a logic 1 into the shift register and the differentiated pulse train signal clears the shift register before the next clock pulse. This results in the output of the shift register remaining at logic 0 at normal conditions. If, however, missing pulses occur (such as those shown in FIGS. 8B and C, at 56 and 57, respectively) then the pulse train contains no transition capable of being differentiated to reset the shift register 202.

If the shift register continues to be clocked without being reset by the differentiated pulse train, the logic 1 is shifted to the output of the shift register and the integrator 203 control voltage begins to rise. The length of the shift register, i.e., the number of individual shift register elements, serves as the means of determining the minimum number of missed pulses required before action is taken to attenuate the input signal to avoid clipping. The output of integrator 203 is a voltage representative of the clipping distortion. This voltage is fed through a network, to be described below, to the voltage controlled attenuator 20 shown at the upper portion of FIG. 2. This action causes attenuation of the input signal to eliminate the overmodulation condition. The nature of attenuator 20 is well known in the art and is shown, for example, in U.S. Pat. No. 4,318,053.

Referring now to the lower portion of FIG. 2, it can be seen that the shift register in a preferred embodiment comprises flip-flops FF1, FF2, FF3 and FF4, but may comprise as many as six or more flip-flops. Jumpers J1, J2 and J3 can be installed to eliminate one or more of the flip-flops from the shift register and thus, adjust the minimum missed pulse threshold. In operation of the individual flip-flops, a clock pulse applied to the clock (CLK) input which transitions from a "0" to a "1", causes the Q output to transition from a "0" to a "1". The Q output remains at 1 until a pulse applied to the clear (CLR) terminal forces the Q output to the "0" state. As indicated in FIG. 2, the D input is initially set at a "1" level. When the clock transitions from "0" to "1", the information on the D terminal is transferred to the Q output terminal.

It can thus be seen that each time a pulse is missing, a "1" will be transferred successively from FF1 to FF2, etc., depending on the number of flip-flops in the shift register. For example, if jumper J1 is connected, only two missing pulses will be required before an output pulse is delivered from FF2 to the anode side of diode D1. Similarly, if jumper J2 is connected, three missing pulses will be required, and so on.

The differentiator, designated as 204 in FIG. 2A, consists of capacitor C1, resistor R3 and resistor R4. By adjusting the values of these components, the time constant of the differentiation can be adjusted to insure the proper reset of the shift register with minimum pulse width.

Diode D1 and capacitor C2 form the basic output integrator. Resistors R1 and R2 adjust the attack and decay of the integrator, with the decay time constant being equal to R2 C2 and the attack time constant being equal to R1 C2.

The output of the integrator is a voltage representative of the number of missed pulses and, as previously explained, pulses are missed from the pulse train only at the onset of clipping. The integrator output is a ramp voltage, so that attenuation does not instantaneously occur upon output at the Q connected to diode D1. Similarly, because of the decay time constant of the integrator, attenuation does not immediately cease upon the absence of the predetermined number of missing pulses.

The negative voltage initially stored in capacitor 53 is determined by a voltage divider consisting of resistors 54, 56 and 57. This reference voltage stored by capacitor 53 will prevent transistor 55 from turning on to cause the voltage controlled attenuator 20 to attenuate the audio signal applred to the feedback network. When a predetermined voltage proportional to the clipping distortion, as explained above, is applied to the cathode of diode 61, the diode will become forward biased which, in turn, will result in an increase in the collector current of transistor 55 coupled to the voltage controlled attenuator 20. This action will cause the attenuator to reduce the magnitude of the audio input signal to prevent the overdrive condition. The current produced by transistor 55 will be proportional to the extent of overdrive for which compensation is desired.

Figure 5:
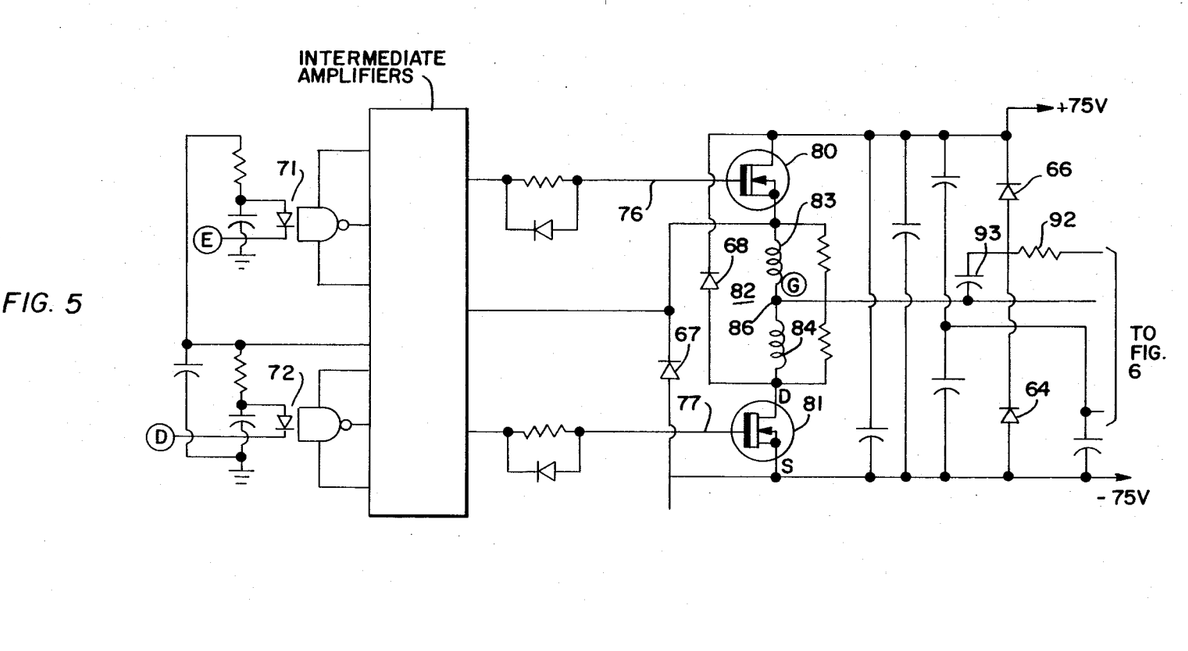
FIG. 5 illustrates the power switching circuitry.

The power switches of FIG. 5 function to amplify the output waveforms produced upon the collectors of transistors 42 and 44 of FIG. 4. Terminal D of transistor 42 is coupled to terminal D of FIG. 5 whereas terminal E of transistor 44 is coupled to terminal E of FIG. 5. Optical isolation switching elements 71 and 72, actuated in accordance with the output pulse trains produced by the modulator transistors 42 and 44, are coupled via intermediate amplifiers, to the input circuits of high power MOSFET elements 80 and 81 in the push-pull power amplifier circuit 82. The drain of field effect element 80 is coupled to +75 volts, whereas the source terminal of element 81 is coupled to a −75 volt bus. The output of the push-pull high current power amplifier is taken at terminal G which is the center tapped junction point between inductors 83 and 84.

Figure 6:
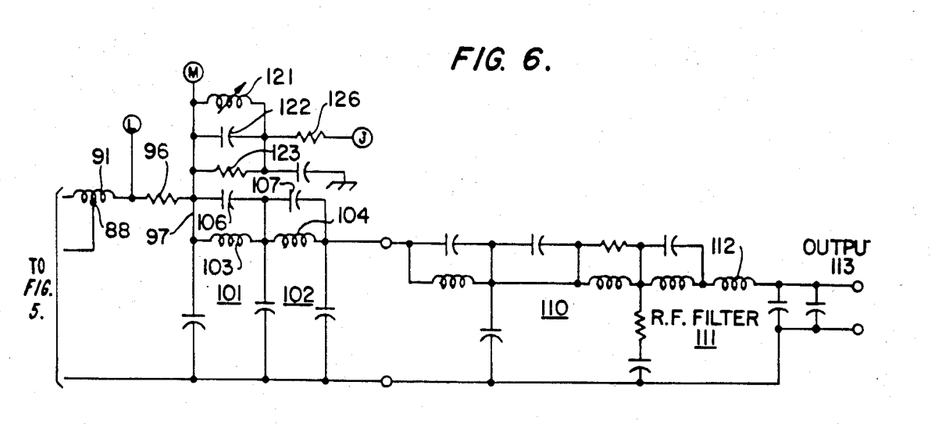
FIG. 6 illustrates the reconstruction filter and R.F. filter at the output of the system.

Referring now to FIG. 6 which discloses the various sections of reconstruction filter 13 of FIG. 1, terminal G is coupled to a tap 88 of tapped inductor or autotransformer 91. The left-hand terminal of inductor 91 is coupled to terminal G via resistor 92 and capacitor 93, while the right-hand terminal of autotransformer 91 is coupled to resistor 96 which is in turn coupled to the input 97 of the notch filter portion of low-pass filter network; sections 101 and 102 thereof include inductors 103, 104 and capacitors 106 and 107. FIG. 6 further includes low-pass filter stage 110 terminating at an R.F. frequency filtering stage 111, acting in accordance with the invention, to completely eliminate any residual pulse train signals which might be present at the system output. The right hand portion of inductor 112 is coupled to output terminal 113 of the system. The low-pass filter, having the components listed below, consists of a fundamental low pass filter with a Chebyshev characteristic coupled to a series of notch filters, centered to eliminate the fundamental frequency of the triangular waveform (500 kHz) and the third harmonic of the pulse train.

Figure 3:
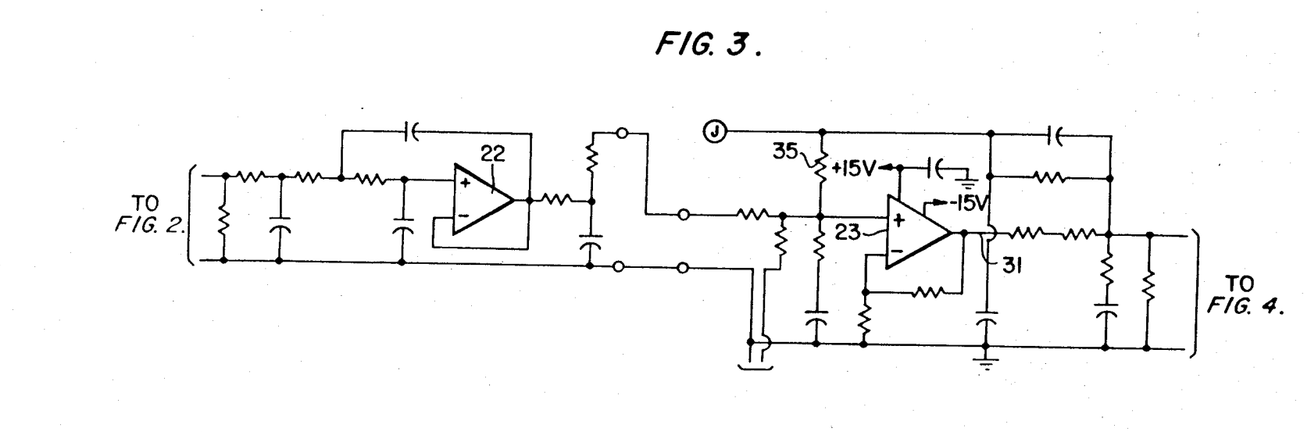
FIG. 3 illustrates the feedback network.

A further feature of the invention employs variable inductor 121, coupled in parallel with capacitor 122, to form a high Q sharp notch filter which is centered approximately at 500 kHz. There is a tendency however for the notch filters to become phase shifted at about the 500 KHz center line and this is used to cause an increase in the efficiency of suppression of the pulse train frequency. Thus, variable inductor 121, is coupled to terminal J of the FIG. 3 feedback network and coupled in turn to the upper input terminal of amplifier 23 via resistor 35. The output 113 of the system is examined for distortion, and inductor 121 is adjusted to change its inductance which affects the feedback signal, until the scope observed distortion is reduced to a minimum during testing. This process is facilitated by including a damping resistor 123, which reduces the Q of the LC circuit including inductor 121. Thus, the signal fed back to terminal J of the feedback network by adjustable inductor 121, is employed to substantially eliminate the closed loop distortion of the output at 113 of FIG. 6. The notch rejection section of the reconstruction filter also includes fixed capacitors 106 and 107, coupled in parallel with inductors 103 and 104 as shown.

In accordance with an additional feature of the invention, tapped inductance 91 of FIG. 6, functioning as an autotransformer, performs crossover distortion correction in the output switching waveform generated by the push-pull power MOSFETS 80 and 81 by transformer action which causes the tapped left hand-portion of the inductor to insert offsets into the switched waveform to effectively buck the crossover distortions resulting from a number of sources such as energy recovery diode overshoots and the MOSFET "on" resistances. System efficiency is increased by eliminating series diodes necessary to prevent forward conduction of the integral body drain diodes in the power MOSFETS. The crossover distortion is produced by energy recovery diode overswings and the on resistances of the MOSFETS. The preferred compensation circuit includes having tap 88 of the autotransformer 91 coupled to amplifier center-tap 86 of the amplifier output reactance comprising inductors 83 and 84. Back biased diodes 64 and 66, coupled across the supply busses and coupled to autotransformer 91 via resistor 92, function to insert the compensation offsets into the waveform, cooperating back biased diodes 67 and 68 being coupled across the amplifier components as shown. Thus, the autotransformer functions as a floating battery source for inserting circulating currents back into the power amplifier via resistor 92, diodes 64 and 66, and the remaining amplifier switching circuit elements.

Figure 7:
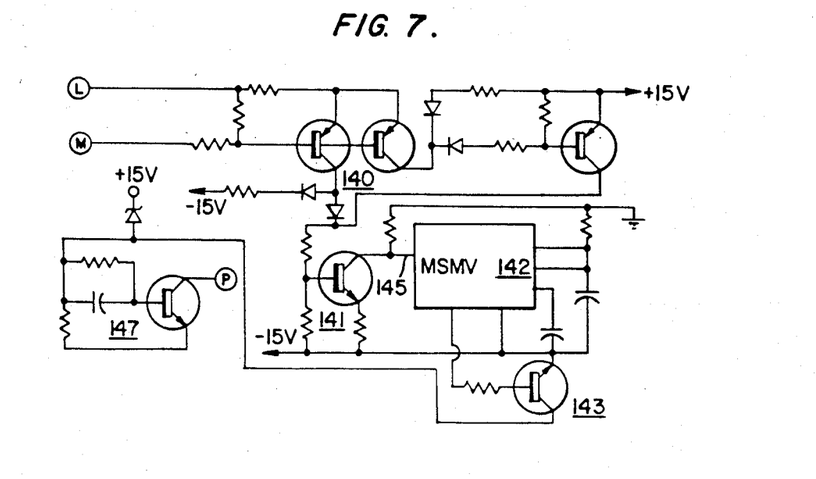
FIG. 7 illustrates the protection circuit.

The protection and monitoring circuitry 17 of FIG. 1, corresponds to FIG. 7 disclosing circuitry for providing protection against the failure of transistor output devices such as the power MOSFETS 80 and 81 or due to other abnormally high currents. In accordance with this feature of the invention, terminals L and M of FIG. 7 are coupled to terminals L and M of FIG. 6 which will produce a voltage across them indicative of the current passing through resistor 96, of the reconstructed DC signal. Should the current through resistor 96 indicating a serious fault be excessive, the resulting voltage impressed across terminals L and M in FIG. 7 will cause MSMV 142 to become triggered, since its input terminal 145 is coupled to the output terminal of switching device 141 which in turn is coupled to terminals L and M via switching device 140. Thus a threshold voltage, produced by excessive current through the reconstruction filter resistor 96, will trigger the MSMV 142, to cause a change of state in switching devices 143 and 147 in tandom therewith. The change of state of switching device 147 will actuate switching devices 148 and 149 in the modulator section of FIG. 4; the collector of switching device 147, namely terminal P, is coupled to terminal P of the switching device 148. The result is an interruption of the current supply normally provided by transistor 149 to the modulator amplifier at the right-hand portion of FIG. 4, and as a result, no further pulses will be impressed upon terminals D and E which are coupled to the input circuits of the power switches of FIG. 5 discussed above. The described arrangement will thus sense excessive current in the amplified audio signal and shut down the system modulator within two microseconds to prevent output device failure. Owing to the recovery period of MSMV 142 the modulator is re-enabled after a fixed time delay, and will of course again inactivate the modulator should the high current fault condition persist. The result is a complete fast acting protection against output short circuit faults and the like.

Thus it should now be appreciated that the aforesaid inventive features of the novel digital energy conversion amplifier, cooperate to provide a very high efficiency system for audio amplification whereby high output power levels, with extremely low distortion (less than 0.1%), and a minimal amount of feedback (approximately 22 dB), have been achieved.

The following is a listing of selected component values utilized in the product to be marketed by the assignee of the present invention:

Capacitor C1: 100 pf
Capacitor C2: 10 μf
Resistance R3: 680 ohms
Resistance 54: 220K
Capacitor 53: 0.015 mfd
Inductor 33: 8 μH
Inductor 84: 0.8 μH
Tapped Inductor 91: 18 μH
Resistor 92: 3 ohms
Resistor 96: 0.03 ohms
Variable Inductor 121: 0.3 μH to 1 μH
Capacitor 122: 0.22 mfd
Resistor 123: 47 ohms
Capacitor 106: 0.2 mfd
Inductor 103: 0.46 μH
Resistor 126: 100 ohms
Capacitor 107: 0.33 mfd
Inductor 104: 0.6 μH
Autotransformer 91: 18 μH
Resistor 92: 0.3 ohms
Capacitor 93: 470 pf
Diodes 64,66,67,68: rur 820
FETS 80,81: irf 240
Inductors 83,86: 0.8 μH.
Resistance R4: 330 ohms
D1: IN 4148
R1: 2.2K
R2: 220K
Shift Register 202: SN 74LS174

The above described embodiments of the invention are merely exemplary, and it should be understood that numerous equivalents to the above described circuitry may be employed by those skilled in the art rather than those specified. Thus the scope of the invention is to be limited only by the language of the following claims and art recognized equivalents.

We claim:

1. In a digital amplifier having an audio signal source for producing an audio frequency analog signal to be amplified, voltage controlled attenuation means, modulation means for converting said analog signal to a pulse width modulated pulse train, means for detecting an onset of a clipping condition in said audio signal and means for converting said onset of clipping condition into a missed pulse in said pulse train, improved means for producing a control voltage proportional to an extent of the clipping condition, said improved means comprising:
   (a) means for counting a predetermined number of missed pulses in said pulse train;
   (b) means for generating a voltage output proportional to the extent of clipping in response to an occurrence of said predetermined number of missed pulses; and
   (c) means for applying said voltage output to said attenuation means for attenuating said audio frequency analog signal.

2. The digital amplifier set forth in claim 1 wherein said means for counting comprises a shift register having a plurality of individual operative stages, the number of operative stages being representative of said predetermined number of missed pulses.

3. The digital amplifier set forth in claim 1 wherein said means for generating a voltage output comprises integrator means.

4. The digital amplifier set forth in claim 2 further comprising means for variably selecting the number of individual stages of said shift register.

5. The digital amplifier set forth in claim 2 further including differentiator means for differentiating the pulses in said pulse train and means for applying said differentiated pulses to one input of the individual stages of said shift register.

6. The digital amplifier set forth in claim 5 wherein said individual stages are flip-flops and said one input is the clear input of said flip-flops.

7. The digital amplifier set forth in claim 6 wherein a clock pulse train is applied to the clock input of each of said flip-flops and the frequency of said clock pulse train is related to the frequency of said pulse width modulated pulse train so as to permit each flip-flop to be reset before the next succeeding pulse is applied to the clock input, in the absence of a missing pulse condition.

* * * * *